(12) United States Patent
Juengling

(10) Patent No.: US 8,946,050 B2
(45) Date of Patent: Feb. 3, 2015

(54) DOUBLE TRENCH WELL FORMATION IN SRAM CELLS

(71) Applicant: GLOBALFOUNDRIES Inc., Grand Cayman (KY)

(72) Inventor: Werner Juengling, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 217 days.

(21) Appl. No.: 13/664,214

(22) Filed: Oct. 30, 2012

(65) Prior Publication Data

US 2014/0117507 A1 May 1, 2014

(51) Int. Cl.
*H01L 21/762* (2006.01)

(52) U.S. Cl.
USPC ............. 438/424; 257/622; 257/E21.546; 257/E29.022

(58) Field of Classification Search
CPC .................. H01L 29/06; H01L 21/762
USPC ............ 438/424; 257/622, E21.546, E29.022
See application file for complete search history.

(56) References Cited

U.S. PATENT DOCUMENTS

| 7,969,776 | B2 * | 6/2011 | Juengling | 365/174 |
|---|---|---|---|---|
| 8,076,721 | B2 * | 12/2011 | Tang et al. | 257/330 |
| 8,178,418 | B1 * | 5/2012 | Ho et al. | 438/445 |
| 8,309,427 | B2 * | 11/2012 | Fishburn et al. | 438/430 |
| 8,415,728 | B2 * | 4/2013 | Chuang et al. | 257/296 |
| 8,501,581 | B2 * | 8/2013 | Tang et al. | 438/427 |
| 8,541,824 | B2 * | 9/2013 | Thompson et al. | 257/288 |
| 8,546,876 | B2 * | 10/2013 | Juengling | 257/331 |
| 8,557,656 | B2 * | 10/2013 | Juengling | 438/242 |
| 8,598,653 | B2 * | 12/2013 | Juengling | 257/331 |
| 8,669,159 | B2 * | 3/2014 | Juengling | 438/283 |
| 8,748,280 | B2 * | 6/2014 | Tang et al. | 438/296 |
| 2008/0050885 | A1 * | 2/2008 | Tang et al. | 438/424 |
| 2012/0126883 | A1 * | 5/2012 | Juengling | 327/581 |
| 2012/0181605 | A1 * | 7/2012 | Grisham et al. | 257/330 |
| 2012/0282755 | A1 * | 11/2012 | Yang | 438/424 |
| 2013/0065371 | A1 * | 3/2013 | Wei et al. | 438/294 |
| 2013/0299884 | A1 * | 11/2013 | Lin et al. | 257/288 |

* cited by examiner

*Primary Examiner* — Fernando L Toledo
*Assistant Examiner* — Victoria K Hall
(74) *Attorney, Agent, or Firm* — Ditthavong & Steiner, P.C.

(57) ABSTRACT

A method is provided for forming SRAM cells with low energy implants. Embodiments include forming deep trenches in a silicon substrate; forming a deep n-well or deep p-well around a bottom of each deep trench; filling the deep trenches with oxide; forming a first or second shallow trench between each pair of adjacent deep trenches; forming a first p-well or first n-well, respectively, above each deep n-well or p-well; forming a second n-well at a bottom of each first shallow trench; forming a p+ region above each second n-well on each side of each first shallow trench; filling the first shallow trenches with oxide; forming a second p-well at a bottom of each second shallow trench; filling the second shallow trenches with oxide; forming a p+ region above each second n-well on each side of each first shallow trench; and forming an n+ region above each second p-well.

16 Claims, 10 Drawing Sheets

DOUBLE TRENCH WELL FORMATION IN SRAM CELLS

TECHNICAL FIELD

The present disclosure relates to semiconductor devices with n-type well (n-well) structures and p-type well (p-well) structures. The present disclosure is particularly applicable in fabricating static random-access memory (SRAM) cells.

BACKGROUND

High energy implants generally used to form n-well and p-well structures work well in technologies where there is sufficient space between n-type metal-oxide-semiconductor (nMOS) field effect transistors and p-type metal-oxide-semiconductor (pMOS) field effect transistors to compensate for lateral straddle caused by the high energy implants. However, in dense SRAM cells, with narrow spacing between n-wells and p-wells, lateral straddle can become an issue.

A need therefore exists for methodology for fabricating SRAM cells with low energy implants of n-wells and p-wells, and the resulting device.

SUMMARY

An aspect of the present disclosure is a method of fabricating SRAM cells with low energy implants.

Another aspect of the present disclosure is a device including trenches having different silicon (Si) depths.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of deep trenches having a first depth in a silicon substrate; forming a deep n-well or deep p-well around a bottom of each of the plurality of deep trenches; filling the plurality of deep trenches with a first oxide; forming a first or second shallow trench between each pair of adjacent deep trenches, each first and second shallow trench having a second depth less than the first depth; forming a first p-well or first n-well, respectively, above each deep n-well or p-well; forming a second n-well at a bottom of each first shallow trench; filling the first shallow trenches with a second oxide; forming a second p-well at a bottom of each second shallow trench; filling the second shallow trenches with the second oxide; forming a p+ region above each second n-well on each side of each first shallow trench; and forming an n+ region above each second p-well on each side of each second shallow trench.

Aspects of the present disclosure include forming the plurality of deep trenches to a depth of 1500 angstroms (Å) to 5000 Å. Other aspects include forming the plurality of deep trenches by etching with sulfur hexafluoride ($SF_6$) or nitrogen trifluoride ($NF_3$). Further aspects include forming the first p-well or first n-well, respectively above each deep n-well or p-well by implanting a p-type or n-type dopant with an energy of 2 kiloelectron volts (keV) to 100 keV. Additional aspects include forming the first and second shallow trenches between the deep trenches by: forming a self-aligned hardmask over the silicon substrate; and etching the first and second shallow trenches through openings in the self-aligned hardmask to a depth of 700 Å to 3000 Å. Other aspects include forming the hardmask of a high aspect ratio process (HARP) material and tetraethyl orthosilicate (TEOS). Further aspects include etching the first and second shallow trenches to form a silicon fin between each deep trench and each adjacent first and second shallow trench, the silicon fins having a pitch of 40 nanometers (nm) to 100 nm. Additional aspects include etching the first and second shallow trenches to form silicon fins each having a width of 8 nm to 50 nm. Further aspects include forming each second n-well or second p-well by: covering each second or first shallow trench, respectively, and adjacent silicon fins with a photomask; and implanting n-type or p-type dopants through the bottom of each first or second shallow trench, respectively, at an energy level of 10 keV to 30 keV. Another aspect includes doping silicon fins adjacent opposite sides of each first or second shallow trench through a mask with p+ or n+ dopants, respectively, to a depth of 50 Å to 1000 Å after filling the second shallow trenches. Other aspects include forming the photomask with openings having a width of 80 nm. Additional aspects include forming the photomask by allowing for misalignment of ½ trench plus fin width. Further aspects include heating the first and second oxides in a high temperature environment for a duration that is sufficient to cause densification of the first and second oxides. Additional aspects include forming four first shallow trenches and two second shallow trenches to form a SRAM cell including at least four nMOS field effect transistors and at least two pMOS field effect transistors.

Another aspect of the present disclosure is a device including a silicon (Si) substrate; a deep n-well or deep p-well formed in the Si substrate; a first p-well or first n-well, respectively, formed above the deep n-well or deep p-well; a plurality of deep trenches having a depth of 1500 Å to 5000 Å and extending into the deep n-well or deep p-well; a plurality of shallow trenches having a depth of 700 Å to 3000 Å, each shallow trench being formed between a pair of adjacent deep trenches; an oxide filling each deep trench and each shallow trench; a silicon fin on each side of each shallow trench; and a second n-well or a second p-well formed through and around a bottom portion of each shallow trench. Aspects of the device include a p+ or n+ region, respectively, above each second n-well or second p-well on each side of each shallow trench. Another aspect includes an n+ or p+ region, respectively, above each second n-well or second p-well on each side of each shallow trench. Other aspects include the device including first, second, third, and fourth deep trenches; a first shallow trench between the first and second deep trenches, a second shallow trench between the second and third deep trenches, and a third shallow trench between the third and fourth deep trenches; and a second p-well formed through and around a bottom portion of the first shallow trench, a second n-well formed through and around a bottom portion of the second shallow trench, and another second p-well formed through and around a bottom portion of the third shallow trench.

Another aspect of the present disclosure is a method including: forming a plurality of deep trenches having a depth of 1500 Å to 5000 Å in a Si substrate; forming a deep n-well or a deep p-well across the Si substrate through the plurality of deep trenches; filling each of the plurality of deep trenches with the first oxide; forming a plurality of first and second shallow trenches having a depth of 700 Å to 3000 Å in the Si substrate, each pair of adjacent deep trenches having one first or second shallow trench therebetween; forming a first p-well or first n-well, respectively, above the deep n-well or deep p-well; forming a first photoresist over the second shallow trenches and adjacent Si; forming a second n-well through a bottom of each first shallow trench; filling each first shallow trench with a second oxide; removing the first photoresist; forming a second photoresist over the first shallow trenches and adjacent Si; forming a second p-well through a bottom of each second shallow trench; filling each second shallow trench with the second oxide; removing the second photoresist; forming a p+ region above each second n-well on each side of each first shallow trench through a first mask; and forming an n+ region above each second p-well on each side of each second shallow trench through a second mask. Other aspects include heating the first and second oxides at a temperature and for a duration sufficient to cause densification of the first and second oxides prior to forming the p+ regions and n+ regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of lateral straddle attendant upon high energy implants generally used to form n-well and p-well structures in SRAM cells. In accordance with embodiments of the present disclosure, shallow trenches are employed where the n-wells and p-wells are to be formed, in between deep trenches. The double trench flow (which forms the shallow and deep trenches) allows vertically and laterally self-aligned and low energy n-well and p-well implants to create n-wells and p-wells that are both narrow and separated by a minimum distance.

Methodology in accordance with embodiments of the present disclosure includes forming a plurality of deep trenches having a first depth in a silicon substrate; forming a deep n-well or deep p-well around a bottom of each of the plurality of deep trenches; filling the plurality of deep trenches with a first oxide; forming a first or second shallow trench between each pair of adjacent deep trenches, each first and second shallow trench having a second depth less than the first depth; forming a first p-well or first n-well, respectively, above each deep n-well or p-well; forming a second n-well at a bottom of each first shallow trench; forming a p+ region above each second n-well on each side of each first shallow trench; filling the first shallow trenches with a second oxide; forming a second p-well at a bottom of each second shallow trench; filling the second shallow trenches with the second oxide; forming a p+ region above each second n-well on each side of each first shallow trench; and forming an n+ above each second p-well on each of each second shallow trench.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
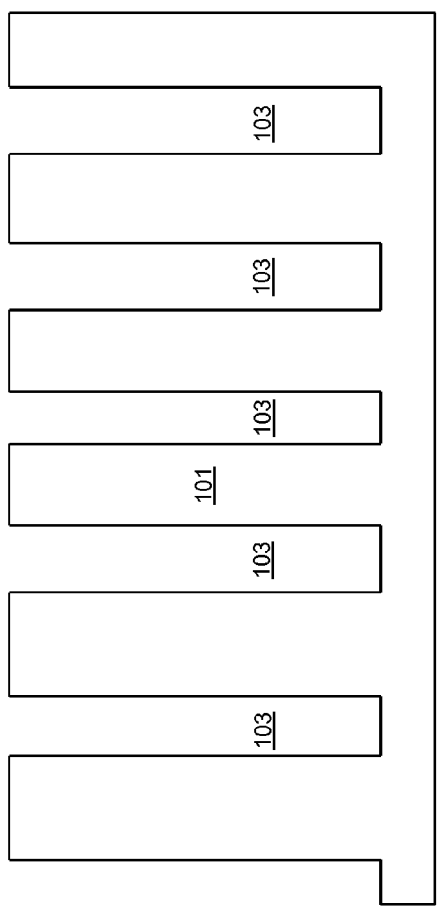
FIGS. 1 through 12 schematically illustrate sequential steps of a method in accordance with an exemplary embodiment of the present disclosure.
Figure 2:
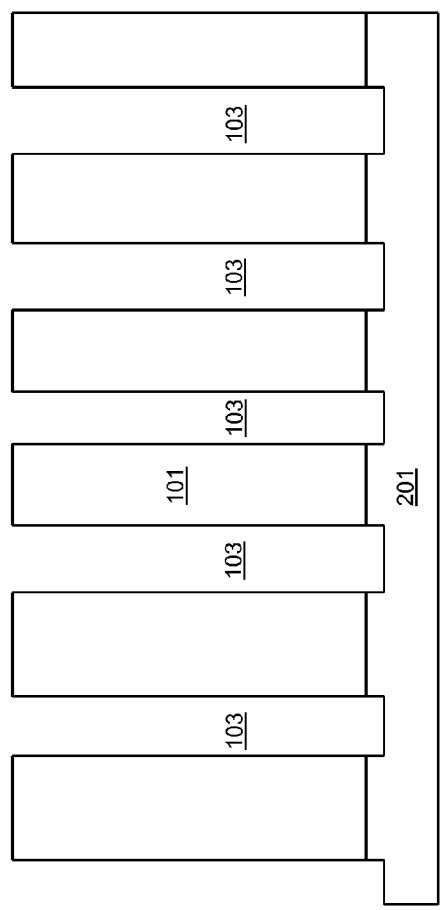

Referring to FIG. 1, deep trenches 103 are etched in a Si substrate 101, for example to a depth of 1500 Å to 5000 Å. The deep trenches 103 may be etched with $SF_6$ or $NF_3$. Once the deep trenches 103 are formed, an n-type or p-type dopant is implanted through the bottom of each of the deep trenches 103 with an energy of 2 keV to 80 keV to form a deep n-well or p-well 201, respectively, around the bottom of each of the deep trenches 103, and spreading across the entire substrate, as illustrated in FIG. 2.

Figure 3:
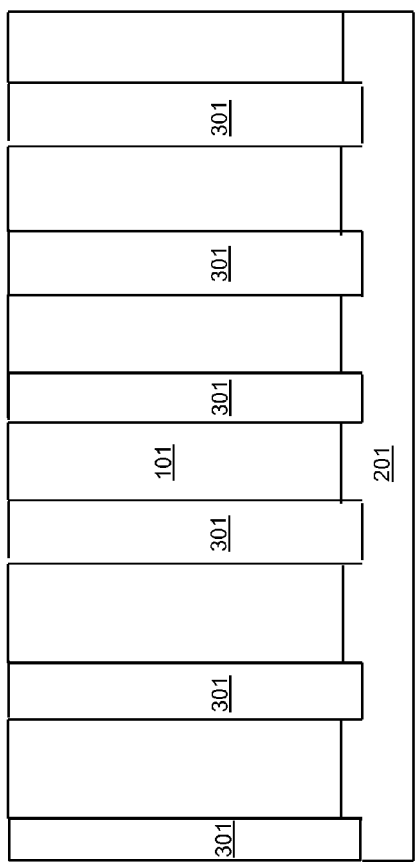

Next, the deep trenches 103 are filled with an oxide 301, as illustrated in FIG. 3. The oxide 301 may include HARP material, spin-on dielectric (SOD) material, or TEOS.

Figure 4:
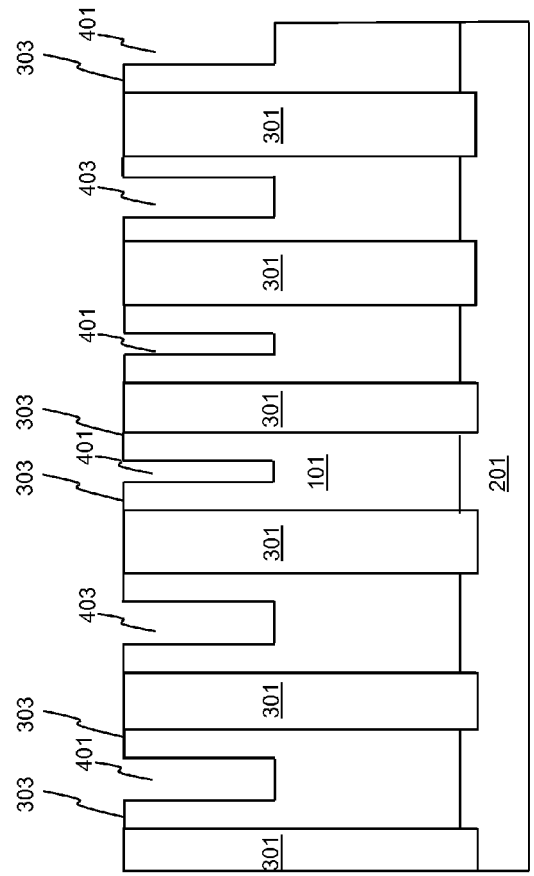

Referring to FIG. 4, shallow trenches 401 and 403 are formed between the oxides 301 (formerly deep trenches 103). The shallow trenches may be self-aligned or may be formed by forming a self-aligned hardmask (not shown for illustrative convenience) over the upper surface of the Si substrate 101 and patterned by a double trench flow to form openings at the locations for the shallow trenches. The double trench flow includes depositing planar layers of HARP, TEOS, and polysilicon, patterning to form pillars of HARP and TEOS having a width of ½ the width of silicon fins, forming TEOS and nitride spacers at opposite sides of the pillars, each having a width of ½ the width of the silicon fins, and removing the pillars, leaving a mask with portions having a silicon fin width and spaces (i.e., openings) therebetween having a width of ½ the silicon fin width, yielding a structure pitch of 2 times the silicon fin width. Then, the shallow trenches 401 and 403 are etched through the openings of the hardmask, e.g. to a depth of 700 Å to 3000 Å. As a result, a silicon fin 303 is formed between each oxide 301 and each adjacent shallow trench 401 or 403. Consequently, the silicon fins 303 have with a width of 8 nm to 50 nm and a pitch of 40 nm to 100 nm.

Figure 5:
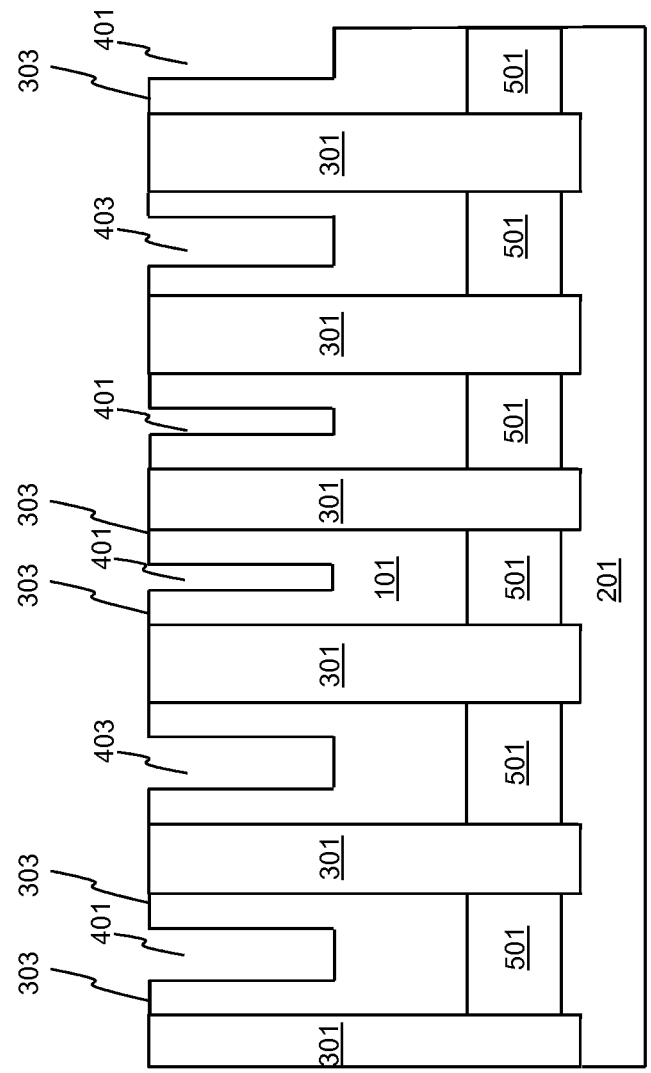

Subsequently, as illustrated in FIG. 5, p-wells or n-wells 501 are formed above the deep n-well or p-well 201 by again implanting a p-type or n-type dopant, respectively, through the bottom of the shallow trenches 401 and 403 with an energy of 2 keV to 80 keV.

Although the deep trenches have been described as being formed first, before the shallow trenches, the order of forming the deep trenches 103 and the shallow trenches 401 and 403 can be based on a number of practical considerations. For example, if the Si substrate 101 is going to be subjected to a significant amount of heat during the filling and densification processes, discussed later, this may favor etching the deep trenches 103 first and then forming the shallow trenches 401 and 403 so that the n-well and p-well implants, e.g., for p-wells or n-wells 501, are only exposed to one densification step. Alternatively, if a long heat treatment is desired for uniform n-well and p-well formation, this may favor forming the shallow trenches 401 and 403 first, followed by two trench fills and densifications with longer heat exposure.

Figure 6:
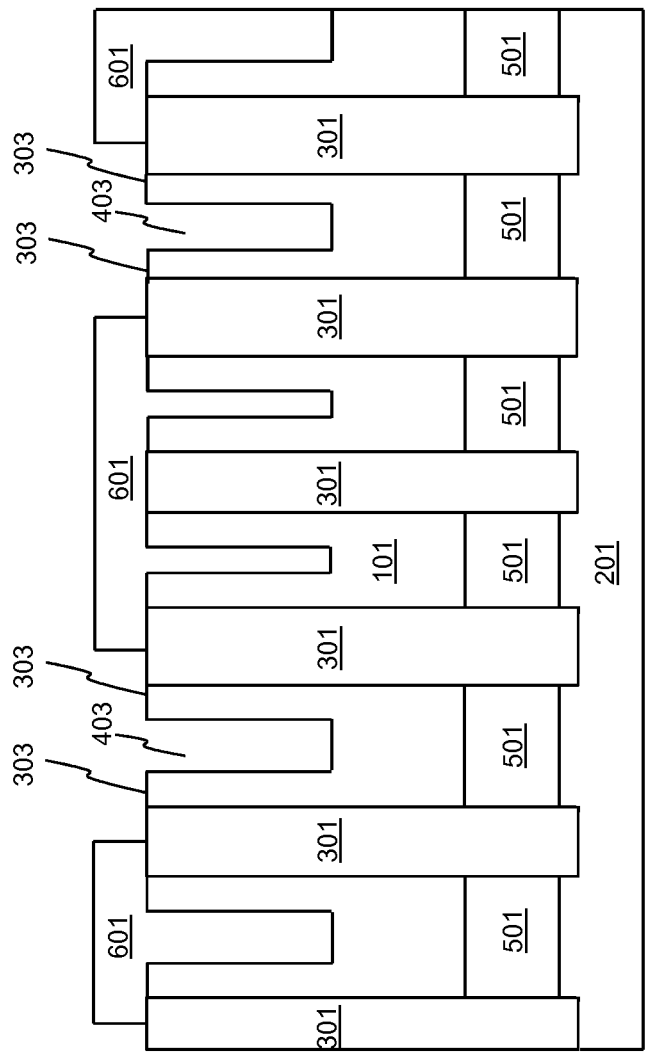

After the p-wells or n-wells 501 have been formed, photomask 601 is formed over and within the shallow trenches 401 and patterned with openings over shallow trenches 403 with edges that stop in the middle of the oxides 301, which are on either side of the shallow trenches 403, as illustrated in FIG. 6. The use of both shallow and deep trenches results in two different silicon depths, e.g. at the bottoms of deep trenches 103 and shallow trenches 401 and 403 or at the bottom of either the shallow trenches 401 or the deep trenches 103 and the at top of the unetched silicon, which in turn form alignment features that can be used to align the photomask 601 to the upper surface of the oxides 301.

The openings in the photomask 601 have a width about 80 nm. In addition, because the shallow trenches 401 and 403 are etched using pitch doubling, which uses a self-aligned hardmask, the photomask 601 may be kept thin. Moreover, the particular formation of the photomask 601 leaves a margin of error of ½ the width of the deep trenches 103 for misalignment before the photomask 601 erroneously either covers the n-well or p-well region, discussed later, that should be open or opens the n-well or p-well region that should be covered. Further, with the two silicon fins 303 on the left and right sides of the n-well or p-well region, the misalignment margin of error is increased by the width of one silicon fin 303. Therefore, the photomask 601 may be misaligned by as much as ½ of the width of the oxides 301 plus the width of one silicon fin 303 before an implanting error may occur.

Figure 7:
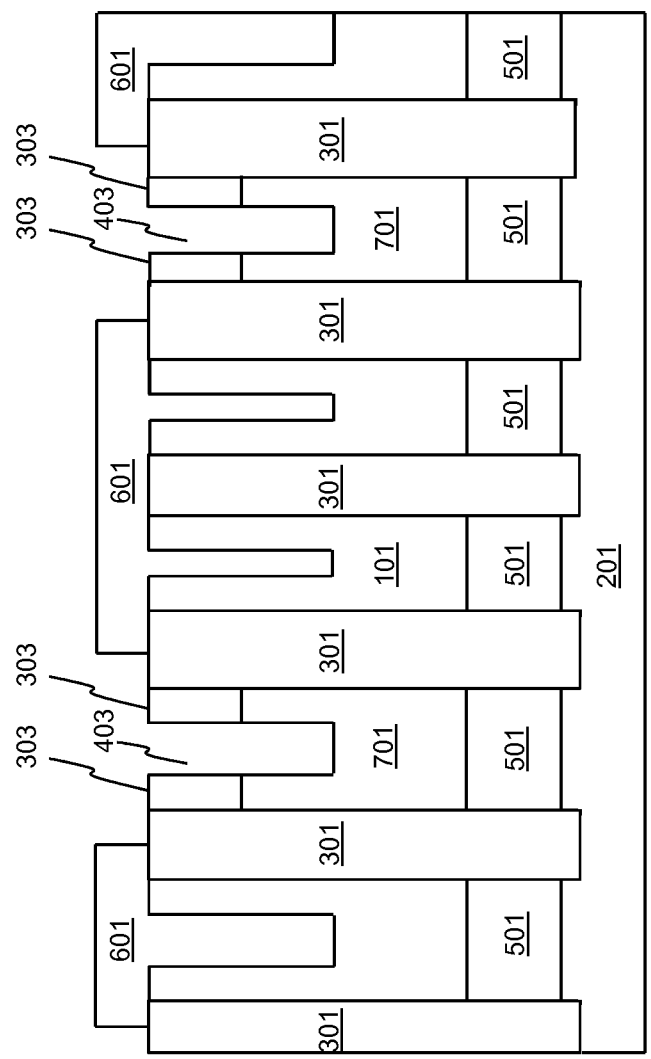

Referring to FIG. 7, n-wells 701 are formed by implanting n-type dopants through the bottom of each shallow trench 403 with a low energy level, for example of 10 keV to 30 keV. The low energy implant is possible because the bottom of the shallow trenches 403 stop in the middle of the n-well regions e.g., n-wells 701. Moreover, by keeping the implant energy low, the potential lateral straddle is small, i.e., the n-well implant stays inside of the n-well silicon.

Figure 8:
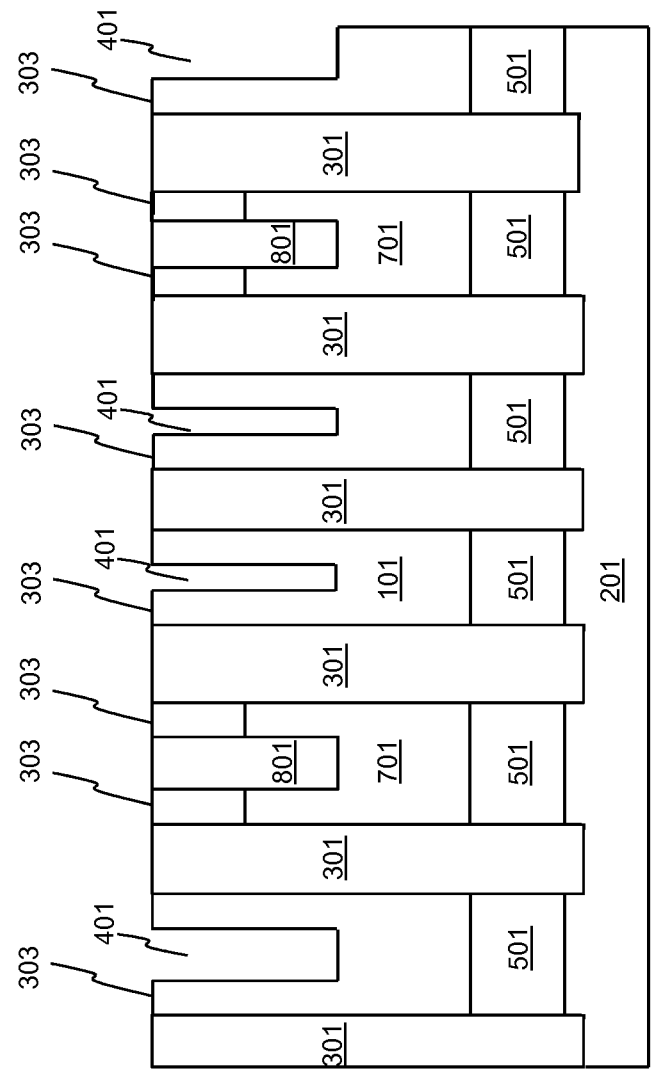
Figure 9:
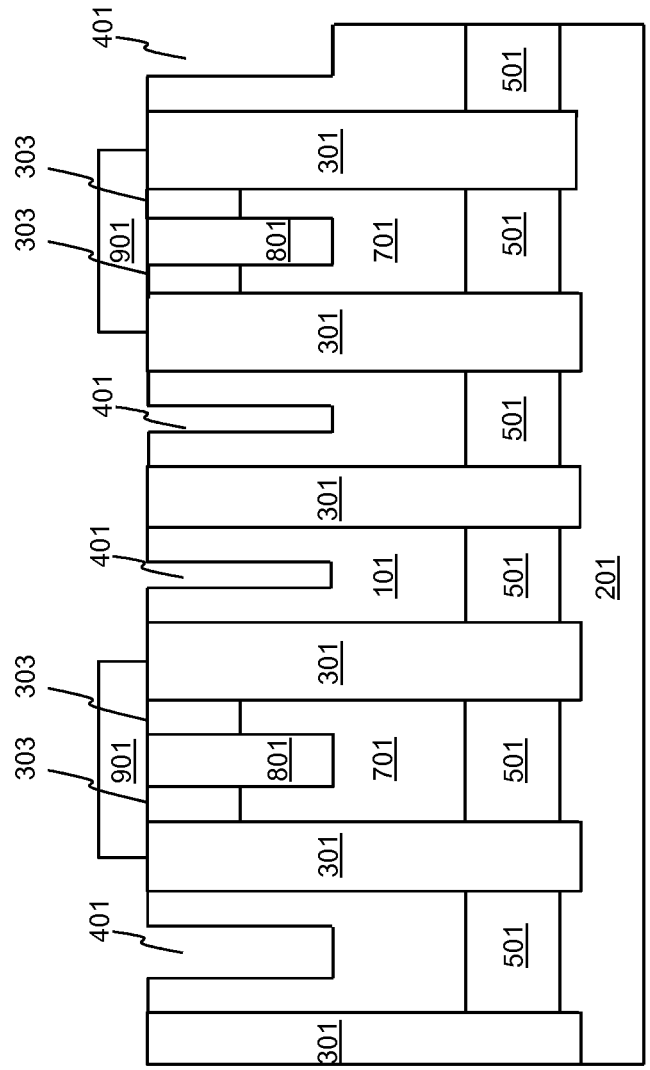

Subsequently, the shallow trenches 403 are filled with an oxide 801, e.g., a HARP material or another insulating material, and the photomask 601 is stripped away from the surface, which again opens the shallow trenches 401, as illustrated in FIG. 8. Adverting to FIG. 9, photomask 901, which may be identical in composition to the photomask 601, is formed to cover the oxide 801 and adjacent silicon fins 303, so that openings in the photomask 901 over shallow trenches 401 stop in the middle of the adjacent oxide 301.

Figure 10:
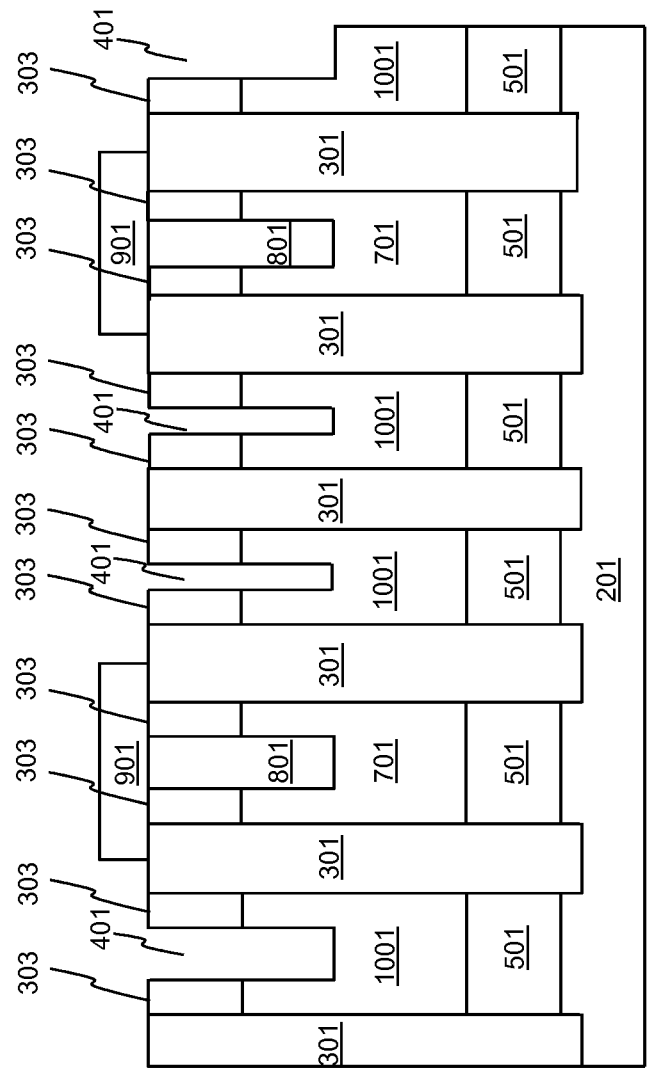

As illustrated in FIG. 10, p-wells 1001 are formed by implanting p-type dopants through the bottom of each shallow trench 401, e.g. with a low energy level of 10 keV to 30 keV.

Figure 11:
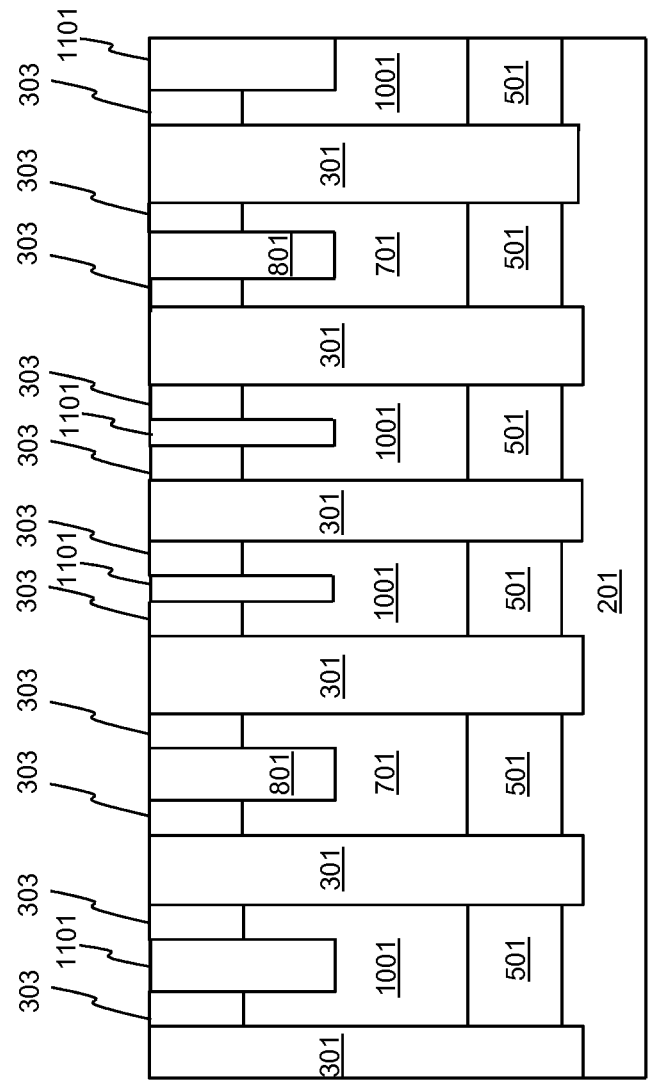

Referring to FIG. 11, the shallow trenches 401 are filled with an oxide 1101, e.g., a HARP material, and the photomask 901 stripped. Although the n-wells have been described as being formed prior to the p-wells, alternatively the photomask 601 may be formed over and within the shallow trenches 403, so that the p-wells may be formed, followed by the photomask 901 being formed over the filled shallow trenches 401, so that the n-wells may be formed. The resulting structure from both flows, depicted in FIG. 11, is then heated in a high temperature environment (for example 800 to 1050° C.) for a duration that is sufficient to cause a densification of the oxides 801 and 1101 (e.g. 30 to 7200 seconds). This is the last long heating step.

Figure 12:
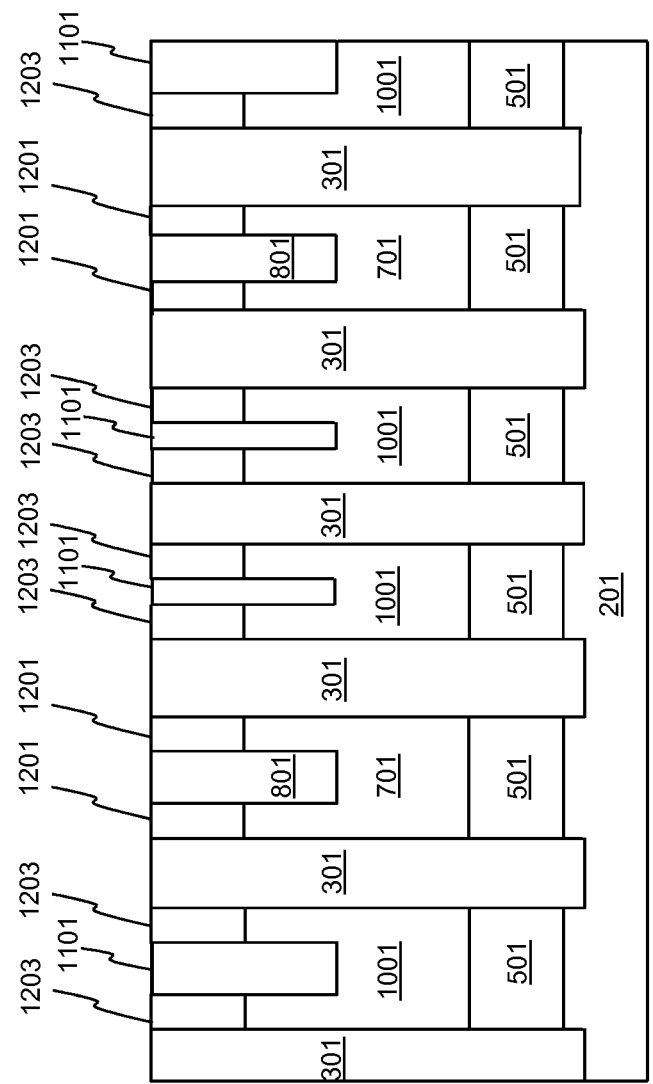

Next, as illustrated in FIG. 12, source/drain implantation may be performed. Specifically, a mask (not shown for illustrative convenience) with openings exposing silicon fins 303 over n-wells 701 may be formed, and the fins 303 may be implanted with p+ dopants, for example to a depth of 50 Å to 1000 Å, forming p+ silicon fins 1201. The mask may be removed and another mask (not shown for illustrative convenience) may be formed exposing silicon fins 303 over p-wells 1001. The exposed fins 303 may then be implanted with n+ dopants, for example to a depth of 50 Å to 1000 Å, forming n+ silicon fins 1203. Additionally, p+ regions may be formed over p-wells 1001 and n+ regions may be formed over n-wells 701 (not shown for illustrative convenience).

The embodiments of the present disclosure can achieve several technical effects including a vertically and laterally self-aligned n-well and p-well implant to create n-wells and p-wells that are narrow and separated by a minimum distance. Moreover, the shallow low energy implant after the trench formations avoids lateral straddle. In addition, the photomask critical dimension for the n-well and p-well can be twice the fin pitch. Also, the silicon fin width functions as a natural spacer to the implant into the trench, which supports separation of the n-well from the p-well implant and the p-well from the n-well implant by at least the width of a silicon fin. The present disclosure therefore enjoys industrial applicability in any of various types of highly integrated semiconductor devices including SRAM cells.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of comprising:
    forming a plurality of deep trenches having a first depth in a silicon substrate;
    forming a deep n-well or deep p-well around a bottom of each of the plurality of deep trenches;
    filling the plurality of deep trenches with a first oxide;
    forming a first or second shallow trench between each pair of adjacent deep trenches, each first and second shallow trench having a second depth less than the first depth;
    forming a first p-well or first n-well, respectively, above each deep n-well or p-well;
    forming a second n-well at a bottom of each first shallow trench;
    filling the first shallow trenches with a second oxide;
    forming a second p-well at a bottom of each second shallow trench; filling the second shallow trenches with the second oxide;
    forming a p+ region above each second n-well on each side of each first shallow trench; and
    forming an n+ region above each second p-well on each side of each second shallow trench.

2. The method according to claim 1, comprising forming the plurality of deep trenches to a depth of 1500 angstroms (Å) to 5000 Å.

3. The method according to claim 1, comprising forming the plurality of deep trenches by etching with sulfur hexafluoride ($SF_6$) or nitrogen trifluoride ($NF_3$).

4. The method according to claim 1 comprising forming the first p-well or first n-well, respectively, above each deep n-well or p-well by implanting a p-type or n-type dopant with an energy of 5 kiloelectron volts (keV) to 80 keV.

5. The method according to claim 1, comprising forming the first and second shallow trenches between the deep trenches by:
    forming a self-aligned hardmask over the silicon substrate; and
    etching the first and second shallow trenches through openings in the self-aligned hardmask to a depth of 700 Å to 3000 Å.

6. The method according to claim 5, comprising forming the hardmask in a self aligned way by depositing high aspect ratio process (HARP) material, TEOS, polysilicon and/or nitride as layers and forming spacers.

7. The method according to claim 5, comprising etching the first and second shallow trenches to form a silicon fin between each deep trench and each adjacent first and second shallow trench, the silicon fins having a pitch of 40 (nanometers) nm to 100 nm.

8. The method according to claim 7, comprising etching the first and second shallow trenches to form silicon fins each having a width of 8 nm to 50 nm.

9. The method according to claim 7, comprising forming each second n-well or second p-well by:
    covering each second or first shallow trench, respectively, and adjacent silicon fins with a photomask; and
    implanting n-type or p-type dopants through the bottom of each first or second shallow trench, respectively, at an energy level of 10 keV to 30 keV.

10. The method according to claim 9, comprising doping silicon fins adjacent opposite sides of each first or second shallow trench through a mask with p+ or n+ dopants, respectively, to a depth of 50 Å to 1000 Å, after filling the second shallow trenches.

11. The method according to claim 9, comprising forming the photomask with openings having a width of 80 nm.

12. The method according to claim 11, comprising forming the photomask by allowing for misalignment of ½ trench plus fin width.

13. The method according to claim 1, comprising heating the first and second oxides in a high temperature environment for a duration that is sufficient to cause densification of the first and second oxides.

14. The method according to claim 1, comprising forming four first shallow trenches and two second shallow trenches to form a static random-access memory (SRAM) cell comprising at least four n-type metal-oxide-semiconductor (NMOS) field effect transistors and at least two p-type metal-oxide-semiconductor (PMOS) field effect transistors.

15. A method of comprising:
    forming a plurality of deep trenches having a depth of 1500 Å to 5000 Å in a silicon (Si) substrate;
    forming a deep n-well or a deep p-well across the Si substrate through the plurality of deep trenches;
    filling each of the plurality of deep trenches with the first oxide;
    forming a plurality of first and second shallow trenches having a depth of 700 Å to 3000 Å in the Si substrate, each pair of adjacent deep trenches having one first or second shallow trench therebetween;
    forming a first p-well or first n-well, respectively, above the deep n-well or deep p-well;
    forming a first photoresist over the second shallow trenches and adjacent Si substrate;
    forming a second n-well through a bottom of each first shallow trench;
    filling each first shallow trench with a second oxide;
    removing the first photoresist;
    forming a second photoresist over the first shallow trenches and adjacent Si substrate;
    forming a second p-well through a bottom of each second shallow trench;
    filling each second shallow trench with the second oxide;
    removing the second photoresist;
    forming a p+ region above each second n-well on each side of each first shallow trench through a first mask; and
    forming an n+ region above each second p-well on each side of each second shallow trench through a second mask.

16. The method according to claim 15, comprising heating the first and second oxides at a temperature and for a duration sufficient to cause densification of the first and second oxides prior to forming the p+ regions and n+ regions.

* * * * *